(12) United States Patent
Cheng et al.

(10) Patent No.: US 11,532,510 B2
(45) Date of Patent: Dec. 20, 2022

(54) CONTACTS AND INTERCONNECT STRUCTURES IN FIELD-EFFECT TRANSISTORS

(71) Applicant: Taiwan Semiconductor Manufacturing Co., Ltd., Hsin-Chu (TW)

(72) Inventors: Chung-Liang Cheng, Changhua County (TW); Ziwei Fang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/176,052

(22) Filed: Feb. 15, 2021

(65) Prior Publication Data
US 2021/0166969 A1 Jun. 3, 2021

Related U.S. Application Data

(62) Division of application No. 16/297,117, filed on Mar. 8, 2019, now Pat. No. 10,923,393.

(Continued)

(51) Int. Cl.
*H01L 23/532* (2006.01)
*H01L 23/522* (2006.01)
(Continued)

(52) U.S. Cl.
CPC .. *H01L 21/76843* (2013.01); *H01L 21/76802* (2013.01); *H01L 21/76865* (2013.01);
(Continued)

(58) Field of Classification Search
None
See application file for complete search history.

(56) References Cited

U.S. PATENT DOCUMENTS

| 6,281,059 B1 * | 8/2001 | Cheng | H01L 27/0266 |
| | | | 438/200 |
| 7,229,923 B2 * | 6/2007 | Catabay | H01L 21/76873 |
| | | | 438/643 |

(Continued)

FOREIGN PATENT DOCUMENTS

| CN | 1933153 A | * | 3/2007 | ......... H01L 23/5223 |
| WO | WO-2011032347 A1 | * | 3/2011 | ....... H01L 21/76816 |

OTHER PUBLICATIONS

Cheng, Chung-Liang, et al., "Structure and Formation Method of Semiconductor Device with Fin Structures", U.S. Appl. No. 16/058,095, filed Aug. 8, 2018, Specification and Drawings, 32 pages.

*Primary Examiner* — Telly D Green
(74) *Attorney, Agent, or Firm* — Haynes and Boone, LLP

(57) ABSTRACT

A semiconductor structure includes a metal gate structure disposed over a semiconductor substrate, an interlayer dielectric (ILD) layer disposed over the metal gate structure, and a gate contact disposed in the ILD layer and over the metal gate structure, where a bottom surface of the gate contact is defined by a barrier layer disposed over the metal gate structure, where sidewall surfaces of the gate contact are defined by and directly in contact with the ILD layer, and where the barrier layer is free of nitrogen.

20 Claims, 9 Drawing Sheets

Related U.S. Application Data

(60) Provisional application No. 62/735,507, filed on Sep. 24, 2018.

(51) Int. Cl.
  *H01L 21/768* (2006.01)
  *H01L 29/78* (2006.01)

(52) U.S. Cl.
  CPC .... *H01L 21/76877* (2013.01); *H01L 23/5226* (2013.01); *H01L 23/53261* (2013.01); *H01L 23/53266* (2013.01); *H01L 29/785* (2013.01)

(56) References Cited

U.S. PATENT DOCUMENTS

| | | | |
|---|---|---|---|
| 8,772,109 B2 | 7/2014 | Colinge | |
| 8,778,797 B2* | 7/2014 | Gao | H01L 21/76877 |
| | | | 438/677 |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 9,721,889 B1* | 8/2017 | Niu | H01L 23/53266 |
| 9,818,695 B2* | 11/2017 | Huang | H01L 21/76802 |
| 9,824,970 B1* | 11/2017 | Zhang | H01L 23/528 |
| 10,553,481 B2* | 2/2020 | Chang | H01L 21/76886 |
| 2002/0060363 A1* | 5/2002 | Xi | H01L 21/76877 |
| | | | 438/653 |
| 2007/0167010 A1* | 7/2007 | Furusawa | H01L 23/53238 |
| | | | 257/E21.585 |
| 2010/0151673 A1* | 6/2010 | Furusawa | H01L 23/53238 |
| | | | 257/E21.584 |
| 2010/0176512 A1* | 7/2010 | Yang | H01L 21/76834 |
| | | | 257/774 |
| 2012/0077342 A1* | 3/2012 | Gao | H01L 21/76879 |
| | | | 257/E21.586 |
| 2013/0056836 A1* | 3/2013 | Yu | H01L 21/2855 |
| | | | 257/E21.409 |
| 2014/0035143 A1* | 2/2014 | Lee | H01L 21/76843 |
| | | | 438/653 |
| 2014/0252621 A1* | 9/2014 | Lin | H01L 21/76846 |
| | | | 438/586 |
| 2014/0327140 A1* | 11/2014 | Zhang | H01L 21/28562 |
| | | | 438/653 |
| 2016/0343668 A1* | 11/2016 | Huang | H01L 21/76834 |
| 2018/0315647 A1* | 11/2018 | Wang | H01L 21/76865 |
| 2019/0067093 A1* | 2/2019 | Chang | H01L 21/76846 |
| 2019/0273147 A1* | 9/2019 | Cheng | H01L 21/76814 |
| 2019/0304929 A1* | 10/2019 | Yang | H01L 23/562 |
| 2020/0043721 A1* | 2/2020 | Liou | H01L 21/02211 |
| 2020/0075299 A1* | 3/2020 | Wu | H01L 21/32051 |

* cited by examiner

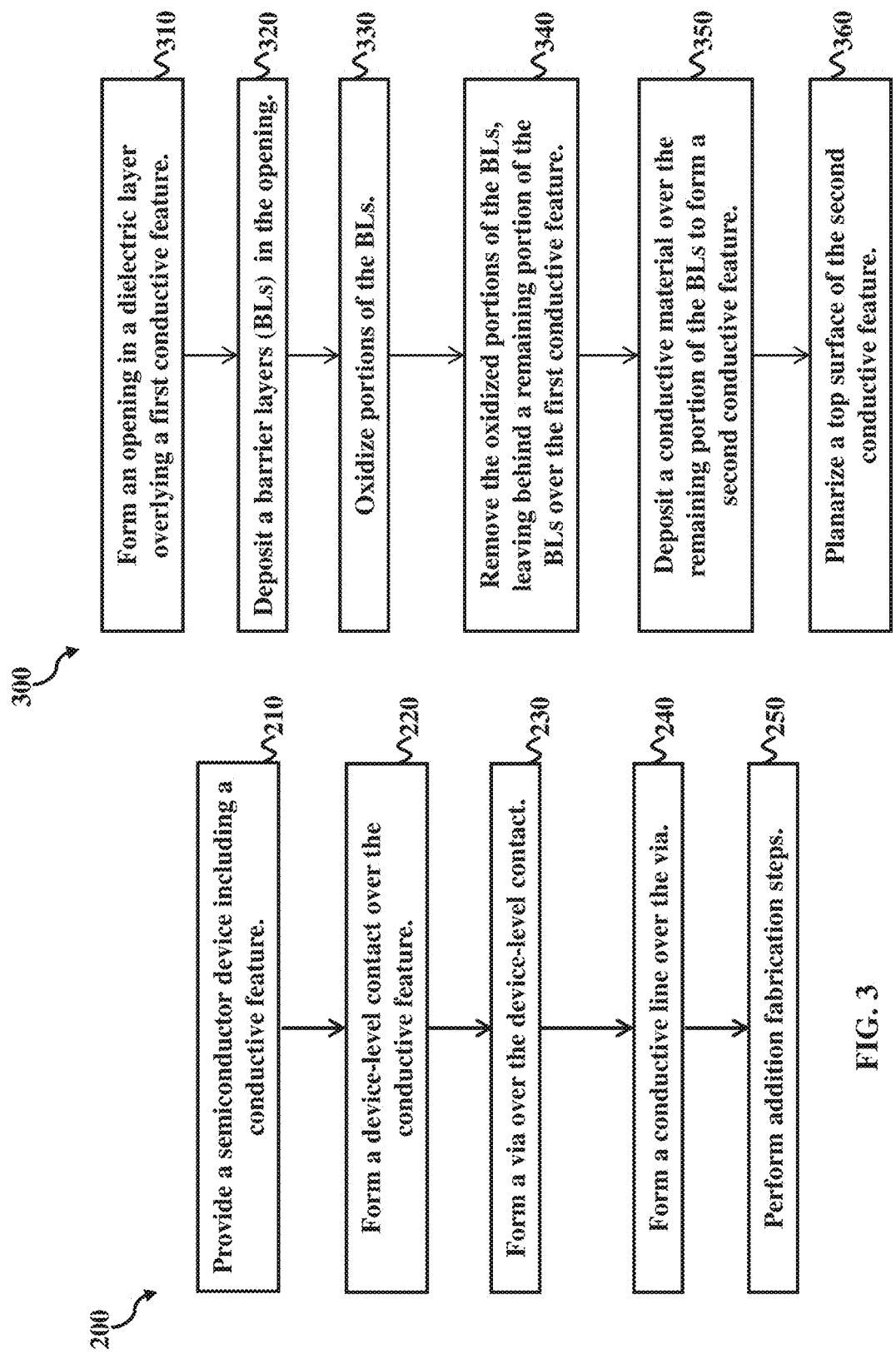

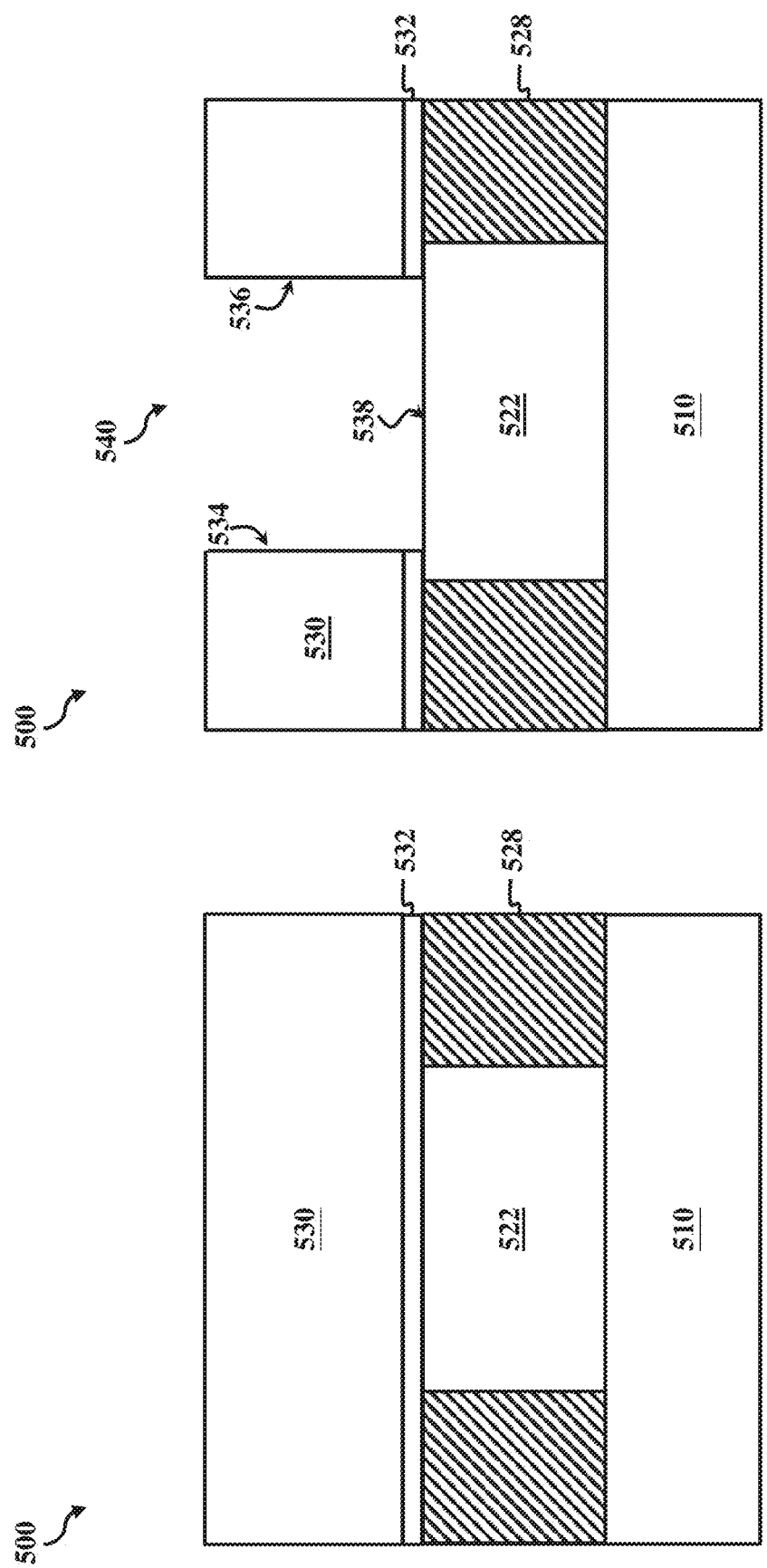

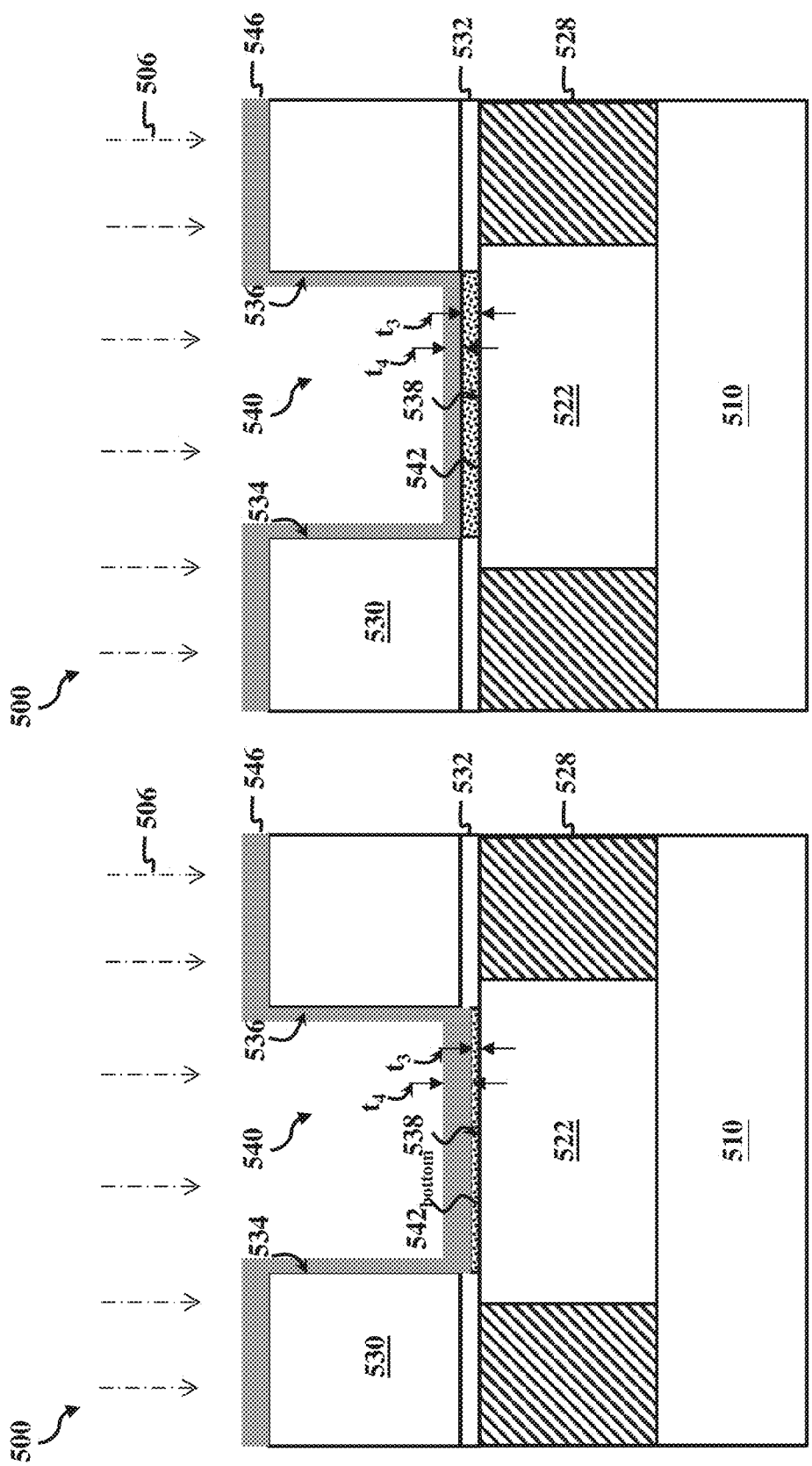

$WCl_5 + TiO_2 \rightarrow WOCl_4 (g) + TiCl_4 (g)$

CONTACTS AND INTERCONNECT STRUCTURES IN FIELD-EFFECT TRANSISTORS

PRIORITY DATA

This application is a Divisional of U.S. application Ser. No. 16/297,117, filed Mar. 8, 2019, which claims priority to U.S. Provisional Patent Application Ser. No. 62/735,507, entitled "Contacts and Interconnect Structures in Filed-Effect Transistors" and filed Sep. 24, 2018, the entire disclosure of which is hereby incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as features sizes decrease and aspect ratios increase, barrier layers implemented in multilayer interconnect structures (such as device-level contacts and vias) have been observed to increase contact resistance and limit amount of conductive material to be included in the interconnect structures. Accordingly, although existing contact features have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3 is a flow chart of a method for fabricating a semiconductor structure according to various aspects of the present disclosure.

FIG. 4 is a flow chart of a method for fabricating a semiconductor structure according to various aspects of the present disclosure.

FIGS. 5A, 5B, 5C, 5D, 5E, 5F, 5G, 5I, and 5J are fragmentary diagrammatic views of a semiconductor structure at intermediate fabrication stages of the method of FIGS. 3 and/or 4 according to various aspects of the present disclosure.

FIG. 5H is a schematic depiction of an example chemical reaction occurring at an intermediate fabrication stage of the method of FIGS. 3 and/or 4 according to various aspects of the present disclosure.

DETAILED DESCRIPTION

Figure 1:
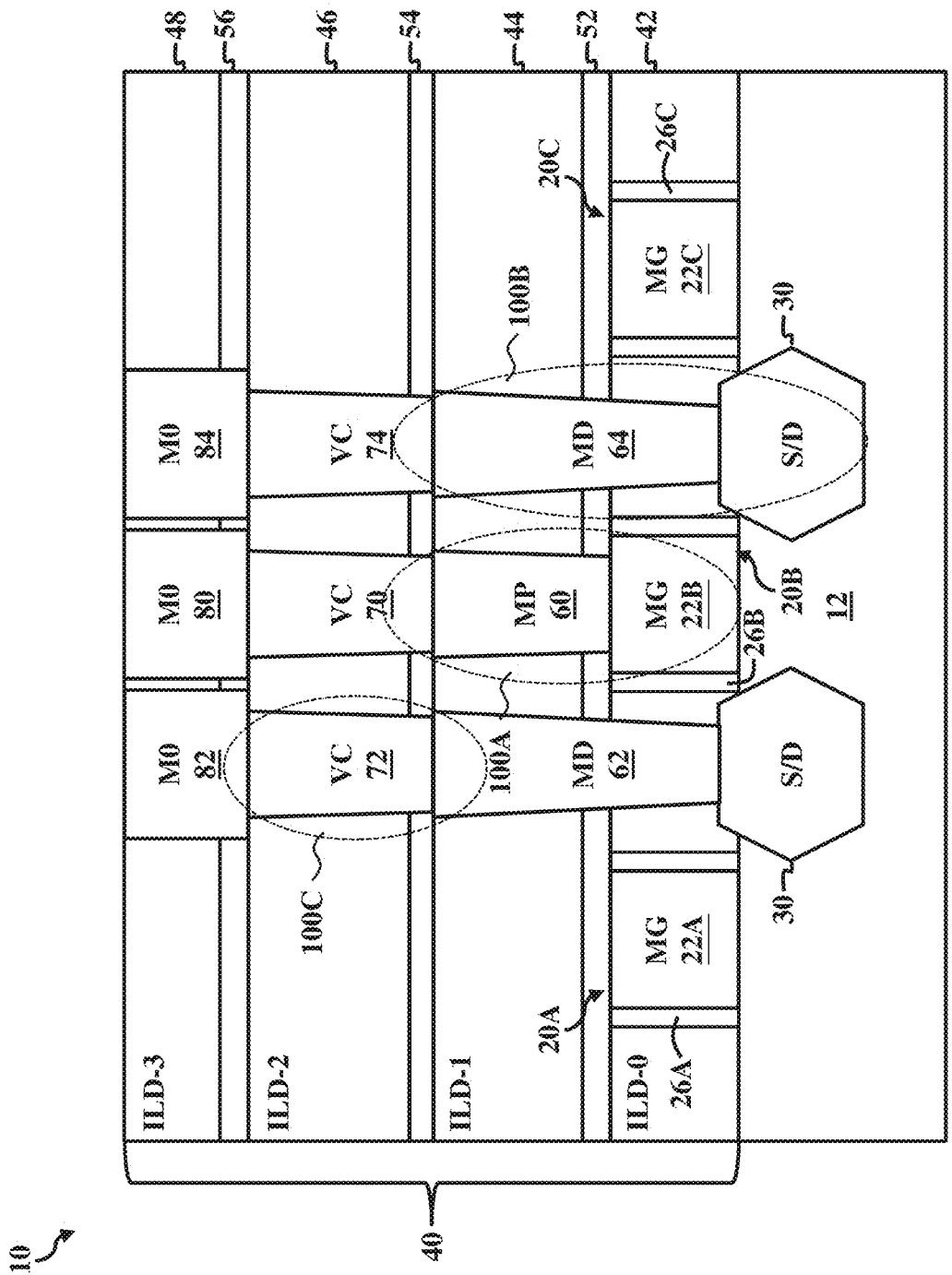
FIG. 1 is a fragmentary diagrammatic view of an integrated circuit device, in portion or entirety, according to various aspects of the present disclosure.

The present disclosure relates generally to integrated circuit devices, and more particularly, to interconnect structures for integrated circuit devices.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating interconnect structures that interconnect IC features fabricated by FEOL processes (referred to herein as FEOL features or structures) and MEOL processes (referred to herein as MEOL features or structures), thereby enabling operation of the IC devices. The present disclosure explores methods of forming interconnect features during MEOL and BEOL processes for improved IC device performance.

FIG. 1 is a fragmentary diagrammatic view of an integrated circuit device 10, in portion or entirety, according to various aspects of the present disclosure. Integrated circuit device 10 may be included in a microprocessor, a memory, and/or other integrated circuit device. In some implementations, integrated circuit device 10 is a portion of an integrated circuit (IC) chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or multi-gate transistors, such as fin-like FETs (FinFETs). FIG. 1 has been simplified for the sake of clarity to better understand the inventive concepts of the present disclosure. Additional features can be added in integrated circuit device 10, and some of the features described below can be replaced, modified, or eliminated in other embodiments of integrated circuit device 10.

Integrated circuit device 10 includes a substrate (e.g., a wafer) 12. In the depicted embodiment, substrate 12 includes silicon. Alternatively or additionally, substrate 12 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 12 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 12 can include various doped regions (not shown) depending on design requirements of integrated circuit device 10. In some implementations, substrate 12 includes p-type doped regions (for example, p-type wells) doped with p-type dopants, such as boron (for example, $BF_2$), indium, other p-type dopant, or combinations thereof. In some implementations, substrate 12 includes n-type doped regions (for example, n-type wells) doped with n-type dopants, such as phosphorus, arsenic, other n-type dopant, or combinations thereof. In some implementations, substrate 12 includes doped regions formed with a combination of p-type dopants and n-type dopants. The various doped regions can be formed directly on and/or in substrate 12, for example, providing a p-well structure, an n-well structure, a dual-well structure, a raised structure, or combinations thereof. An ion implantation process, a diffusion process, other suitable doping process, or combinations thereof can be performed to form the various doped regions.

An isolation feature(s) (not shown) is formed over and/or in substrate 12 to isolate various regions, such as various device regions, of integrated circuit device 10. For example, isolation features define and electrically isolate active device regions and/or passive device regions from each other. Isolation features include silicon oxide, silicon nitride, silicon oxynitride, other suitable isolation material, or combinations thereof. Isolation features can include different structures, such as shallow trench isolation (STI) structures, deep trench isolation (DTI) structures, and/or local oxidation of silicon (LOCOS) structures. In some implementations, isolation features include STI features. For example, STI features can be formed by etching a trench in substrate 12 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation features. In some embodiments, STI features include a multi-layer structure that fills the trenches, such as a silicon nitride layer disposed over an oxide liner layer.

Various gate structures are disposed over substrate 12, such as a gate structure 20A, a gate structure 20B, and a gate structure 20C. In some implementations, one or more of gate structures 20A-20C interpose a source region and a drain region, where a channel region is defined between the source region and the drain region. The one or more gate structures 20A-20C engage the channel region, such that current can flow between the source/drain regions during operation. In some implementations, gate structures 20A-20C are formed over a fin structure, such that gate structures 20A-20C each wrap a portion of the fin structure. For example, one or more of gate structures 20A-20C wrap channel regions of the fin structure, thereby interposing a source region and a drain region of the fin structure.

Gate structures 20A-20C include metal gate (MG) stacks, such as a metal gate stack 22A, a metal gate stack 22B, and a metal gate stack 22C. Metal gate stacks 22A-22C are configured to achieve desired functionality according to design requirements of integrated circuit device 10, such that metal gate stacks 22A-22C include the same or different layers and/or materials. In some implementations, metal gate stacks 22A-22C include a gate dielectric (for example, a gate dielectric layer; not shown) and a gate electrode (for example, a work function layer and a conductive bulk layer; not shown). Metal gate stacks 22A-22C may include numerous other layers, for example, capping layers, interface layers, diffusion layers, barrier layers, hard mask layers, or combinations thereof. In some implementations, the gate dielectric layer is disposed over an interfacial layer (including a dielectric material, such as silicon oxide), and the gate electrode is disposed over the gate dielectric layer. The gate dielectric layer includes a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof.

In some implementations, the gate dielectric layer is a high-k dielectric layer. The gate electrode includes a conductive material, such as polysilicon, aluminum (Al), copper (Cu), titanium (Ti), tantalum (Ta), tungsten (W), molybdenum (Mo), cobalt (Co), TaN, NiSi, CoSi, TiN, WN, TiAl, TiAlN, TaCN, TaC, TaSiN, other conductive material, or combinations thereof. In some implementations, the work function layer is a conductive layer tuned to have a desired work function (such as an n-type work function or a p-type work function), and the conductive bulk layer is a conductive layer formed over the work function layer. In some implementations, the work function layer includes n-type work function materials, such as Ti, silver (Ag), manganese (Mn), zirconium (Zr), TaAl, TaAlC, TiAlN, TaC, TaCN, TaSiN, other suitable n-type work function materials, or combinations thereof. In some implementations, the work function layer includes a p-type work function material, such as Mo, Al, ruthenium (Ru), TiN, TaN, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, and/or Cu. The conductive bulk layer may additionally or collectively include polysilicon, Ti, Ta, metal alloys, other suitable materials, or combinations thereof.

Gate structures 20A-20C are formed by deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atmospheric pressure CVD (APCVD), electroplating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. The etching processes include dry etching processes, wet etching processes, other etching processes, or combinations thereof. Metal gate stacks 22A-22C are fabricated according to a gate-last process, a gate-first process, or a hybrid gate-last/gate-first process. In gate-last process implementations, gate structures 20A-20D include dummy gate stacks that are subsequently replaced with metal gate stacks 22A-22C. The dummy gate stacks include, for example, an interfacial layer (including, for example, silicon oxide) and a dummy gate electrode layer (including, for example, polysilicon). In such implementations, the dummy gate electrode layer is removed, thereby forming openings (trenches) in which metal gate stacks 22A-22C are formed.

Gate structures 20A-20C further include spacers 26A-26C, which are disposed adjacent to (for example, along sidewalls of) metal gate stacks 22A-22C, respectively. Spacers 26A-26C are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 12 and subsequently anisotropically etched to form spacers 26A-26C. In some implementations, spacers 26A-26C include a multi-layer structure, such as a first dielectric layer that includes silicon nitride and a second dielectric layer that includes silicon oxide. In some implementations, more than one set of spacers, such as seal spacers, offset spacers, sacrificial spacers, dummy spacers, and/or main spacers, are formed adjacent to metal gate stacks 22A-22C. In such implementations, the various sets of spacers can include materials having different etch rates. For example, a first dielectric layer including silicon and oxygen (for example, silicon oxide) can be deposited over substrate 12 and subsequently anisotropically etched to form a first spacer set adjacent to metal gate stacks 22A-22C (or dummy metal gate stacks, in some implementations), and a second dielectric layer including silicon and nitrogen (for example, silicon nitride) can be deposited over substrate 12 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features in substrate 12 before and/or after forming spacers 26A-26C, depending on design requirements of integrated circuit device 10.

Epitaxial source features and epitaxial drain features 30 (referred to as epitaxial source/drain features 30) are disposed in source/drain regions of substrate 12. For example, a semiconductor material is epitaxially grown on substrate 12, forming epitaxial source/drain features 30 over a source region and a drain region of substrate 12. In the depicted embodiment, gate structure 20B interposes epitaxial source/drain features 30, and a channel region is defined between epitaxial source/drain features 30. Gate structure 20B and epitaxial source/drain features 30 thus form a portion of a transistor, such a pull-up transistor or a pull-down transistor, of integrated circuit device 10. Gate structure 20B and/or epitaxial source/drain features 30 are thus alternatively referred to as device features. In some implementations, epitaxial source/drain features 30 wrap source/drain regions of a fin structure. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 12. Epitaxial source/drain features 30 are doped with n-type dopants and/or p-type dopants. In some implementations, where integrated circuit device 10 is configured as an n-type device (for example, having an n-channel), epitaxial source/drain features 30 are epitaxial layers including silicon and/or carbon, where silicon-containing epitaxial layers or silicon-carbon-containing epitaxial layers are doped with phosphorous, other n-type dopant, or combinations thereof (for example, forming a Si:P epitaxial layer or a Si:C:P epitaxial layer). In some implementations, where integrated circuit device 10 is configured as a p-type device (for example, having a p-channel), epitaxial source/drain features 30 are epitaxial layers including silicon and germanium, where the silicon germanium containing epitaxial layers are doped with boron, other p-type dopant, or combinations thereof (for example, forming a Si:Ge:B epitaxial layer). In some implementations, epitaxial source/drain features 30 include materials and/or dopants that achieve desired tensile stress and/or compressive stress in the channel region. In some implementations, epitaxial source/drain features 30 are doped during deposition by adding impurities to a source material of the epitaxy process. In some implementations, epitaxial source/drain features 30 are doped by an ion implantation process subsequent to a deposition process. In some implementations, annealing processes are performed to activate dopants in epitaxial source/drain features 30 and/or other source/drain regions of integrated circuit device 10 (for example, HDD regions and/or LDD regions).

A multilayer interconnect (MLI) feature 40 is disposed over substrate 12. MLI feature 40 electrically couples various devices (for example, transistors, resistors, capacitors, and/or inductors) and/or components (for example, gate structures and/or source/drain features) of integrated circuit device 10, such that the various devices and/or components can operate as specified by design requirements of integrated circuit device 10. MLI feature 40 includes a combination of dielectric layers and conductive layers configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI feature 40. During operation of integrated circuit device 10, the interconnect structures are configured to route signals between the devices and/or the components of integrated circuit device 10 and/or distribute signals (for example, clock signals, voltage signals, and/or ground signals) to the devices and/or the components of integrated circuit device 10. It is noted that though MLI feature 40 is depicted with a given number of dielectric layers and conductive layers, the present disclosure contemplates MLI feature 40 having more or less dielectric layers and/or conductive layers depending on design requirements of integrated circuit device 10.

In FIG. 1, MLI feature 40 includes one or more dielectric layers, such as an interlayer dielectric layer 42 (ILD-0) disposed over substrate 12, an interlayer dielectric layer 44 (ILD-1) disposed over ILD layer 42, an interlayer dielectric layer 46 (ILD-2) disposed over ILD layer 44, and an interlayer dielectric layer 48 (ILD-3) disposed over ILD layer 46. ILD layers 42-48 include a dielectric material including, for example, silicon oxide, silicon nitride, silicon oxynitride, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), low-k dielectric material, other suitable dielectric material, or combinations thereof. In the depicted embodiment, ILD layers 42-48 are dielectric layers that include a low-k dielectric material (generally referred to as low-k dielectric layers). ILD layers 42-48 can include a multilayer structure having multiple dielectric materials. MLI feature 40 can further include one or more etch stop layers (ESL) disposed over substrate 12, such as an ESL 52 (also referred to as a contact ESL, or CESL 52) disposed between ILD layer 42 and ILD layer 44, an ESL 54 disposed between ILD layer 44 and ILD layer 46, and an ESL 56 disposed between ILD layer 46 and ILD layer 48. In some implementations, a ESL (not shown) is also disposed between substrate 12 and ILD layer 42. ESLs 52-56 include a material different than ILD layers 42-48, such as a dielectric material that is different than the dielectric material of ILD layers 42-48. In the depicted embodiment, where ILD layers 42-48 include a low-k dielectric material, ESLs 52-56 include silicon and nitrogen (for example, silicon nitride or silicon oxynitride). ILD layers 42-48 and/or ESLs 52-56 are formed over substrate 12, for example, by a deposition process, such as CVD, PVD, ALD, PECVD, HDPCVD, MOCVD, RPCVD, LPCVD, ALCVD, APCVD, spin-on dielectric, plating, other suitable methods, or combinations thereof. In some implementations, ILD layers 42-48 and/or ESLs 52-56 are formed by a flowable CVD (FCVD) process that includes, for example, depositing a flowable material (such as a liquid compound) over substrate 12 and converting the flowable material to a solid material by a suitable technique, such as thermal annealing and/or ultraviolet radiation treating. Subsequent to the deposition of ILD layers 42-48 and/or ESLs 52-56, a CMP process and/or other planarization process is performed, such that ILD layers 42-48 and/or ESLs 52-56 have substantially planar surfaces.

A device-level contact 60, a device-level contact 62, a device-level contact 64, a via 70, a via 72, a via 74, a conductive line 80, a conductive line 82, a conductive line 84, a via 90, a via 92, and a via 94 are disposed in ILD layers 42-48 to form interconnect structures. Device-level contacts 60-64 (also referred to as local interconnects or local contacts) electrically couple and/or physically couple IC device features to other conductive features of MLI feature 40. For example, device-level contact 60 is a metal-to-poly (MP) contact, which generally refers to a contact to a gate structure or a gate contact, such as a poly gate structure or a metal gate structure. In the depicted embodiment, device-level contact 60 is disposed on gate structure 20B (in particular, metal gate stack 22B), such that device-level contact 60 connects gate structure 20B to via 70. Device-level contact 60 extends through ILD layer 44 and ESL 52, though the present disclosure contemplates embodiments where device-level contact 60 extends through more than one ILD layer and/or ESL of MLI feature 40. In furtherance of the example, device-level contact 62 and device-level contact 64 are metal-to-device (MD) contacts, which generally refer to contacts to a conductive region of integrated circuit device 10, such as source/drain regions. In the depicted embodiment, device-level contact 62 and device-level contact 64 are disposed on respective epitaxial source/drain features 30, such that device-level contact 62 and device-level contact 64 connect epitaxial source/drain features 30 respectively to via 72 and via 74. Device-level contact 62 and device-level contact 64 extend through ILD layer 42, ILD layer 44, and ESL 52, though the present disclosure contemplates embodiments where device-level contact 62 and/or device-level contact 64 extend through more than one ILD layer and/or ESL of MLI feature 40. In some implementations, device-level contacts 60-64 are MEOL conductive features that interconnect FEOL conductive features (for example, gate structures 20A-20C and/or epitaxial source/drain features 30) to BEOL conductive features (for example, vias 70-74), thereby electrically and/or physically coupling FEOL conductive features to BEOL conductive features.

Vias 70-74 and vias 90-94 electrically couple and/or physically couple conductive features of MLI feature 40 to one another. For example, via 70 is disposed on device-level contact 60, such that via 70 connects device-level contact 60 to conductive line 80; via 72 is disposed on device-level contact 62, such that via 72 connects device-level contact 62 to conductive line 82; and via 74 is disposed on device-level contact 64, such that via 74 connects device-level contact 64 to conductive line 84. Additionally, vias 90-94 are disposed on conductive lines 80, 82, and 84, respectively, such that vias 90-94 connect conductive lines 80, 82, and 84 to additional conductive lines (not shown) of the MLI feature 40. In the depicted embodiment, vias 70-74 extend through ILD layer 46 and ESL 54, and vias 90-94 extend through ILD layer 48 to contact conductive lines 80-84, though the present disclosure contemplates embodiments where vias 70-74 and vias 90-94 extend through more than one ILD layer and/or ESL of MLI feature 40. In some implementations, vias 70-74 are BEOL conductive features that interconnect MEOL conductive features (for example, device-level contacts 60-64) to BEOL conductive features (for example, conductive lines 80-84), thereby electrically and/or physically coupling MEOL conductive features to BEOL conductive features. In some implementations, vias 90-94 are BEOL conductive features that interconnect BEOL conductive features in different ILD layers to one another, such as conductive lines 80-84 to conductive lines (not shown) disposed in other ILD layers (not shown) overlying ILD layers 42-48, thereby electrically and/or physically coupling BEOL conductive features of integrated circuit device 10. Device-level contacts 60-64, vias 70-74, conductive lines 80-84, and vias 90-94 include any suitable conductive material, such as Ru, Co, W, Cu, other suitable conductive materials, or combinations thereof.

One process generally implemented to form a conductive MLI feature (such as a device-level contact or a via) includes forming an ILD layer over a conductive feature (such as a metal gate structure, a source/drain feature, a device-level contact, etc.), patterning the ILD layer to form an opening, depositing one or more barrier layer that lines a bottom and sidewall surfaces of the opening, and filling the opening with a conductive material which directly contacts the barrier layer in the opening. Barrier layers (alternatively referred to as "glue layers") such as those including It, Ta, TiN, TaN, other materials, or combinations thereof are implemented to serve as diffusion barrier for certain conductive bulk materials and/or as an adhesion layer for preventing peeling of various material layers of the conductive feature. However, due to their generally higher resistance than conductive bulk materials included in conductive MLI features, barrier layers have been observed to increase contact resistance of the MLI features. Additionally, as MLI feature sizes (i.e., opening sizes) decrease and aspect ratios increase, because barrier layers are formed on the bottom and the sidewall surfaces of the opening, they may limit the amount of the conductive bulk material that can be deposited in the opening, which further affects the contact resistance of the MLI features. To address these and other challenges, embodiments of the present disclosure provide methods of forming conductive MLI features with improved contact resistance by reducing the amount of barrier layer material formed in the opening. Furthermore, embodiments of the present disclosure also provide improved compositions of the conductive material used to form the conductive MLI features.

Figure 2C:
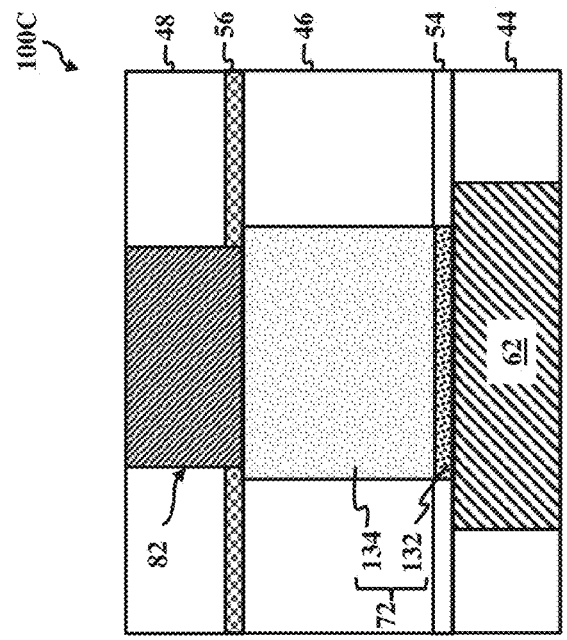
FIG. 2C is an enlarged fragmentary diagrammatic view of an embodiment of the integrated circuit device of FIG. 1 according to various aspects of the present disclosure.
Figure 2A:
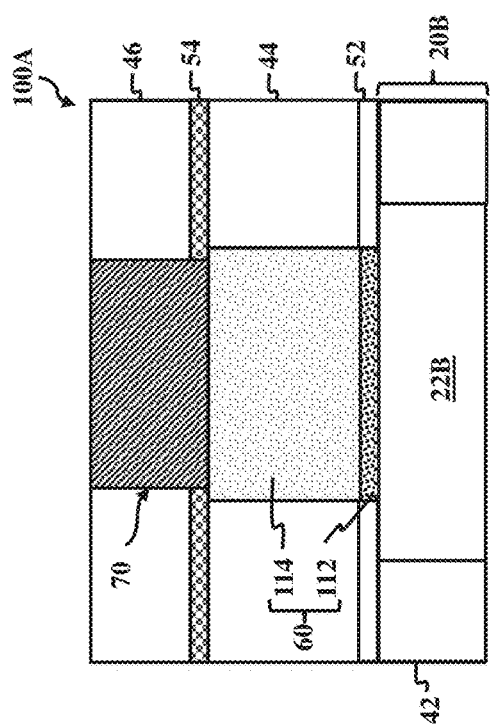
FIG. 2A is an enlarged fragmentary diagrammatic view of an embodiment of the integrated circuit device of FIG. 1 according to various aspects of the present disclosure.

FIG. 2A is an enlarged fragmentary view of a semiconductor structure 100A, which is a portion of integrated circuit device 10 according to various aspects of the present disclosure. Semiconductor structure 100A includes metal gate stack 22B, device-level contact 60 disposed over metal gate stack 22B, and via 70 disposed over device-level contact 60, where device-level contact 60 extends through ESL 52 and ILD layer 44 to interconnect metal gate stack 22B to via 70, and where via 70 extends through ESL 54 and ILD layer 46 to interconnect device-level contact 60 to additional BEOL feature such as conductive line 80 (FIG. 1). In FIG. 2A, metal gate stack 22B, which may further include features such as spacers (not depicted), is disposed in ILD layer 42, device-level contact 60 is disposed in ILD layer 44 and over metal gate stack 22B, and via 70 is disposed in ILD layer 46 and over device-level contact 60. In some implementations, ESL 52 and/or ESL 54 are omitted from semiconductor structure 100A. FIG. 2A has been simplified for the sake of clarity to better understand the inventive concepts of the present disclosure. Additional features can be added in semiconductor structure 100A, and some of the features described below can be replaced, modified, or eliminated in other embodiments of semiconductor structure 100A.

Metal gate stack 22B and via 70 have been discussed in detail about FIG. 1 above. Device-level contact 60 includes a barrier layer 112 disposed over a top surface of metal gate stack 22B and a conductive bulk layer 114 disposed over barrier layer 112. Barrier layer 112 defines a bottom surface of device-level contact 60 and may include Ti, Ta, Al, other suitable materials, or combinations thereof. In some embodiments, barrier layer 112 is free of nitrogen. In some embodiments, barrier layer 112 includes W. An amount of W included in barrier layer 112 may be at least 0.1 wt % and may be up to about 5 wt %. In some embodiments, barrier layer 112 is configured as a diffusion barrier to prevent conductive material in conductive bulk layer 114 from diffusing into surrounding material layers, such as ILD layer 44 and/or metal gate stack 22B. In further embodiments, barrier layer 112 is configured to scavenge oxygen from metal gate stack 22B disposed below, thereby reducing amount of oxidation of material layers in metal gate stack 22B and lowering contact resistance at an interface between device-level contact 60 and metal gate stack 22B. In some embodiments, barrier layer 112 includes at least one material layer.

Conducive bulk layer 114 directly contacts ILD layer 44, which defines sidewall surfaces of device-level contact 60. Conductive bulk layer 114 may include any suitable conductive material, such as Ru, Co, W, Cu, other suitable conductive materials, or combinations thereof. In some embodiments, conductive bulk layer 114 includes a material having a lower resistivity than W. In the depicted embodiment, conductive bulk layer 114 includes Ru, Co, or a combination thereof and may be formed by a bottom-up selective growth process, i.e., conductive bulk layer 114 selectively forms over barrier layer 112 and does not form along sidewalls defined by ILD layer 44. Notably, materials such as Ru and Co have lower resistivity than W owing to their smaller electron mean-free-paths in comparison to W. This reduction in resistivity, which results in lowered contact resistance in conductive bulk layer 114, is especially prevalent as features sizes decrease. Furthermore, because diffusion of Ru and/or Co into the surrounding material layers (e.g., ILD layer 44 and/or metal gate stack 22B) is much less extensive than W, the amount of barrier layer 112 that would otherwise serve as diffusion barrier may be reduced (compared to what may generally be needed for W) when Ru and/or Co are implemented as conductive bulk layer 114. With a reduced amount of barrier layer 112, the amount of conductive bulk layer 114 formed thereover may accordingly be increased, further reducing the contact resistance of device-level contact 60. Though not depicted, in some implementations, device-level contact 60 may further include other material layers, such as capping layers, adhesion layers, other suitable material layers, or combinations thereof.

Figure 2B:
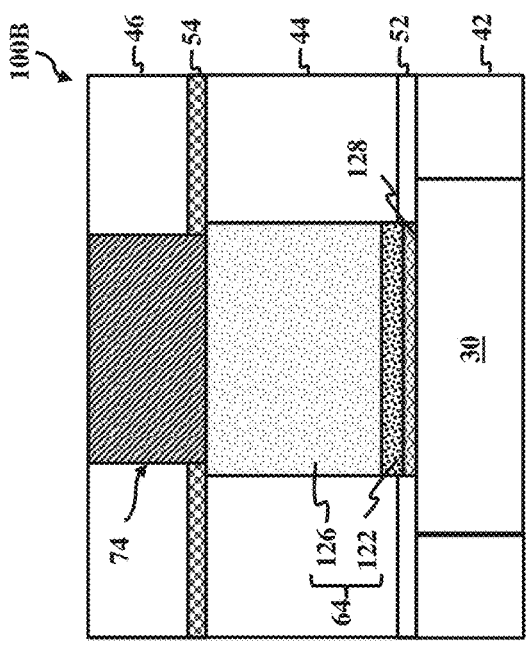
FIG. 2B is an enlarged fragmentary diagrammatic view of an embodiment of the integrated circuit device of FIG. 1 according to various aspects of the present disclosure.

FIG. 2B is an enlarged fragmentary view of a semiconductor structure 100B, which is a portion of integrated circuit device 10 according to various aspects of the present disclosure. Semiconductor structure 100B includes epitaxial source/drain feature 30, a silicide layer 128 disposed over epitaxial source/drain feature 30, device-level contact 64 disposed over silicide layer 128, and via 74 disposed over device-level contact 64, where device-level contact 64 extends through ESL 54 and ILD layer 46 to interconnect epitaxial source/drain features 30 to via 74, and where via 74 extends through ESL 54 and ILD layer 46 to interconnect device-level contact 64 to additional BEOL feature such as conductive line 84 (FIG. 1). In some implementations, ESL 52 and/or ESL 54 are omitted from semiconductor structure 100B. FIG. 2B has been simplified for the sake of clarity to better understand the inventive concepts of the present disclosure. Additional features can be added in semiconductor structure 100B, and some of the features described below can be replaced, modified, or eliminated in other embodiments of semiconductor structure 100B.

Epitaxial source/drain feature 30 and via 74 have been discussed in detail in reference to FIG. 1 above. Silicide layer 128 includes Si and at least one metallic element, such as Ti, Ta, Al, other suitable metallic elements, or combinations thereof. In the depicted embodiment, silicide layer 128 includes Si and Ti in the form of TiSi and/or $TiSi_2$. Device-level contact 64 includes a barrier layer 122 disposed over a top surface of epitaxial source/drain feature 30 and over the silicide layer 128, and a conductive bulk layer 126 disposed over barrier layer 122. Barrier layer 122 defines a bottom surface of device-level contact 64. Barrier layer 122 may be similar to barrier layer 112 of semiconductor structure 100A and may include Ti, Ta, Al, other suitable materials, or combinations thereof. In some embodiments, barrier layer 122 is free of nitrogen. In some embodiments, barrier layer 122 includes W. An amount of W included in barrier layer 122 may be at least 0.1 wt % and may be up to about 5 wt %.

Conducive bulk layer 126 directly contacts ILD layer 44, which defines sidewall surfaces of device-level contact 64. Conductive bulk layer 126 may be similar to conductive bulk layer 114 and may include Ru, Co, W, Cu, other suitable conductive materials, or combinations thereof. In some embodiments, conductive bulk layer 126 includes a material having a lower resistivity than W. In the depicted embodiment, conductive bulk layer 126 includes Ru, Co, or a combination thereof and may be formed by a bottom-up selective growth process, i.e., conductive bulk layer 126 selectively forms over barrier layer 122 and does not form along sidewalls defined by ILD layer 44. Though not depicted, in some implementations, device-level contact 64 may further include other material layers, such as capping layers, adhesion layers, other suitable material layers, or combinations thereof.

FIG. 2C is an enlarged fragmentary view of a semiconductor structure 100C, which is a portion of integrated circuit device 10 according to various aspects of the present disclosure. Semiconductor structure 100C includes device-level contact 62, via 72 disposed over device-level contact 62, and conductive line 82 disposed over via 72, where via 72 extends through ESL 54 and ILD layer 46 to interconnect device-level contact 62 to conductive line 82, and where conductive line 82 extends through ESL 56 and ILD layer 48 to interconnect via 72 to additional BEOL features. In some implementations, ESL 54 and/or ESL 56 are omitted from semiconductor structure 100C. FIG. 2C has been simplified for the sake of clarity to better understand the inventive concepts of the present disclosure. Additional features can be added in semiconductor structure 100C, and some of the features described below can be replaced, modified, or eliminated in other embodiments of semiconductor structure 100C.

Device-level contact 62 and conductive line 82 have been discussed in detail in reference to FIG. 1 above. Via 72 includes a barrier layer 132 disposed over a top surface of device-level contact 62 and a via bulk layer 134 disposed over barrier layer 132. Barrier layer 132 defines a bottom surface of via 72. Barrier layer 132 may be similar to barrier layer 112 of semiconductor structure 100A or barrier layer 122 of semiconductor structure 100B and may include Ti, Ta, Al, other suitable materials, or combinations thereof. In some embodiments, barrier layer 132 is free of nitrogen. In some embodiments, barrier layer 132 includes W. An amount of W included in barrier layer 132 may be at least 0.1 wt % and may be up to about 5 wt %.

Via bulk layer 134 directly contacts ILD layer 46, which defines sidewall surfaces of via 72. Via bulk layer 134 may be similar to conductive bulk layer 114 or conductive bulk layer 126 and may include Ru, Co, W, Cu, other suitable conductive materials, or combinations thereof. In some embodiments, via bulk layer 134 includes a material having a lower resistivity than W. In the depicted embodiment, via bulk layer 134 includes Ru, Co, or a combination thereof and may be formed by a bottom-up selective growth process, i.e., via bulk layer 134 selectively forms over barrier layer 132 and does not form along sidewalls defined by ILD layer 46. Though not depicted, in some implementations, via 72 may further include other material layers, such as capping layers, adhesion layers, other suitable material layers, or combinations thereof.

FIG. 3 is a flow chart of a method 200 for fabricating a semiconductor device having a structure such as that shown in FIGS. 2A-2C according to various aspects of the present disclosure. At block 210, method 200 provides (or is provided with) a semiconductor device having a conductive feature, such as a metal gate stack and epitaxial source/drain features, disposed over a substrate. At block 220, method 200 forms a device-level contact over the conductive feature. At block 230, method 200 forms a via contact over the device-level contact. At block 240, method 200 forms a conductive line over the via contact. At block 250, the method 200 performs additional fabrication steps to the semiconductor device. Additional steps can be provided before, during, and after method 200, and some of the steps described can be moved, replaced, or eliminated for additional embodiments of method 200.

FIG. 4 is a flow chart of a method 300 for fabricating a conductive feature, such as device-level contact 60, device-level contact 64, or via 72 of semiconductor structures 100A-100C, respectively, as illustrated in FIGS. 2A-2C, according to various aspects of the present disclosure. In some implementations, method 300 can be implemented in method 200 at block 220 or 230, depending upon specific design requirements. Specifically, at block 310, method 300 forms an opening in a dielectric layer overlying a first conductive feature, such as metal gate stack 22B, epitaxial source/drain feature 30, or device-level contact 62 corresponding to semiconductor structures 100A-100C, respectively, in FIGS. 2A-2C. At block 320, method 300 forms a barrier layer on sidewall surfaces and a bottom surface of the opening as well as over a top surface of the dielectric layer. In the present disclosure, the barrier layer may include more than one sub-layers as discussed in detail below. At block 330, method 300 applies oxygen plasma to oxidize portions of the barrier layer. At block 340, method 300 etches the oxidized portions of the barrier layer, such that a portion of the barrier layer remains on the bottom surface of the opening. At block 350, method 300 selectively deposits a conductive material over the remaining portion of the barrier layer to form a second conductive feature, such as device-level contact 60, device-level contact 64, or via 72 corresponding to semiconductor structures 100A-100C, respectively, in FIGS. 2A-2C. At block 360, method 300 planarizes a top surface of the device-level contact. Additional steps can be provided before, during, and after method 300, and some of the steps described can be moved, replaced, or eliminated for additional embodiments of method 300.

FIGS. 5A-5G, 5I, and 5J are fragmentary views of a semiconductor structure 500, in portion or entirety, at various fabrication stages associated with method 200 and/or method 300 according to various aspects of the present disclosure. FIGS. 5A-5G, 5I, and 5J have been simplified for the sake of clarity to better understand the inventive concepts of the present disclosure. Additional features can be added in semiconductor structure 500, and some of the features described below can be replaced, modified, or eliminated in other embodiments of semiconductor structure 500.

In FIG. 5A, referring to block 210 of method 200, a substrate 510 is provided having a conductive feature 522 disposed thereover. Substrate 510 is similar to substrate 12 depicted and described in FIG. 1. Conductive feature 522 may be an FEOL feature (such as metal gate stack 22B or epitaxial source/drain feature 30 depicted and described in FIG. 1 and FIGS. 2A-2C) or an MEOL feature (such as device-level contact 62 depicted and described in FIG. 1 and FIGS. 2A-2C). Though not depicted herein, conductive feature 522 may also be a BEOL feature, such as vias 70-74 or conductive lines 80-84 depicted and described in FIG. 1. In the depicted embodiment, conductive feature 522 is formed in a dielectric layer 528, which is similar to ILD layers 42-48 depicted and described in FIG. 1 and FIGS. 2A-2C. In some implementations, conductive feature 522 is formed by any suitable deposition process (for example, PVD, CVD, ALD, or other suitable deposition process).

A dielectric layer 530, similar to ILD layers 42-48 depicted and described in FIG. 1 and FIGS. 2A-2C, is formed over conductive feature 522. For example, CVD, PECVD, spin-on dielectric, other suitable process, or combinations thereof is performed to deposit a low-k dielectric material over conductive feature 522, thereby forming dielectric layer 530. As depicted herein, ESL 532 (or CESL 532), similar to ESLs 52-56 depicted and described in FIG. 1 and FIGS. 2A-2C, can be formed over dielectric layer 528 and conductive feature 522 before forming dielectric layer 530, though the present disclosure contemplates embodiments where ESL 532 may be omitted from semiconductor structure 500. ESL 532 includes a material having a different etching characteristic than a material of dielectric layer 530 and may include, for example, silicon nitride.

In FIG. 5B, referring to block 310 of method 300, an opening 540 is formed in dielectric layer 530 (and, in some implementations, ESL 532) by a patterning process. Opening 540 includes a bottom surface 538 defined by a top surface of conductive feature 522 and sidewall surfaces 534 and 536 defined by dielectric layer 530. In the depicted embodiment, opening 540 extends through dielectric layer 530 and ESL 532. Opening 334 has sidewalls defined by dielectric layer 530 (and ESL 532) and a bottom surface defined by conductive feature 522. The patterning process includes lithography processes and/or etching processes. For example, forming opening 540 includes performing a lithography process to form a patterned resist layer over dielectric layer 530 and performing an etching process to transfer a pattern defined in the patterned resist layer to dielectric layer 530. The lithography process can include forming a resist layer (not depicted) on dielectric layer 530 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of dielectric layer 530. The etching process can include a dry etching process (for example, a reactive ion etching (RIE) process), a wet etching process, other suitable etching process, or combinations thereof. After the etching process, the patterned resist layer is removed from dielectric layer 530, for example, by a resist stripping process. In some implementations, the patterned resist layer is used as an etch mask to remove portions of ESL 532 to extend opening 540, thereby exposing conductive feature 522. Various selective etching processes can be performed. Alternatively, the exposure process can be implemented or replaced by other methods, such as maskless lithography, electron-beam (e-beam) writing, ion-beam writing, and/or nanoimprint technology.

Figures 5C, 5D:
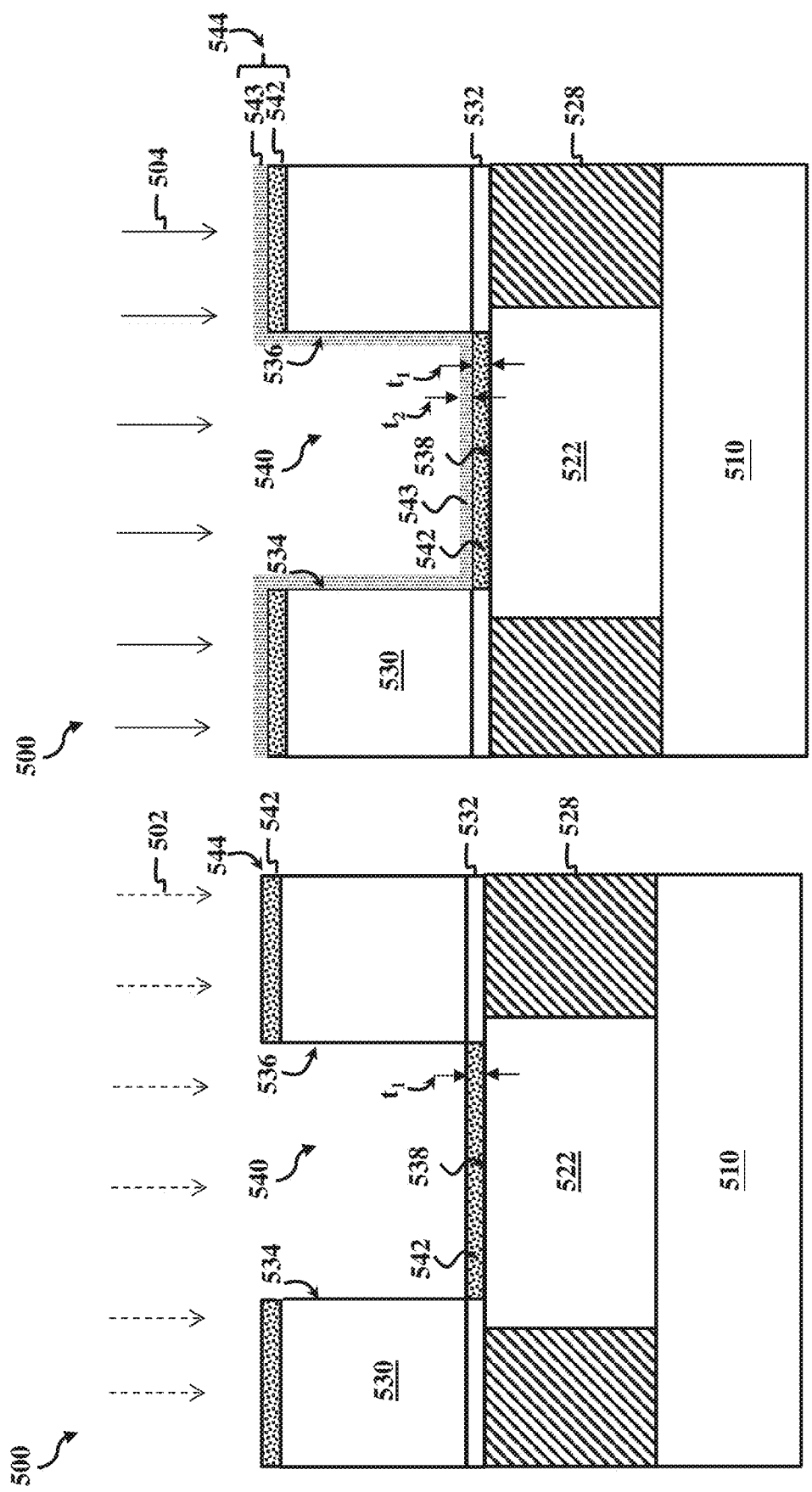

In FIG. 5C, referring to block 320, a sub-layer 542 and a sub-layer 543, together referred to as a barrier layer 544, are formed in opening 540 and over a top surface of dielectric layer 530. In many embodiments, sub-layers 542 and 543 differ in both compositions and methods of forming, which are described in detail below. Sub-layer 542 includes a metal, such as Ti, Ta, Al, other suitable metals, or combinations thereof, and may be substantially free of nitrogen. Sub-layer 542 may be formed by any suitable deposition process, such as PVD, CVD, ALD, other suitable methods, or combinations thereof. In the depicted embodiment, sub-layer 542 is deposited using a directional PVD process at deposition process 502, such that it is deposited on bottom surface 538 of opening 540 and on a top surface of dielectric layer 530, but only minimally on sidewall surfaces 534 and 536 of opening 540. In embodiments in which a minute amount (e.g., less than about 10 Angstrom in thickness) of sub-layer 542 (referred to as a sidewall residual portion of sub-layer 542) is deposited on sidewall surfaces 534 and 536 of opening 540, it will be fully oxidized and removed during subsequent processes described in detail below. In contrast, sub-layer 542 formed on bottom surface 538 of opening 540 and on the top surface of dielectric layer 530 may have a thickness of at least 30 Angstrom. The deposition process 502 may be implemented by a directional deposition (e.g., PVD) process. In one such example, a target located within a PVD chamber and comprising a desired metal (such as Ti or Ta) for forming sub-layer 542 is bombarded with a high-energy source (e.g., heat, current, plasma, etc.) and in turn releases particles that are deposited over semiconductor structure 500. Directional deposition of PVD may be accomplished by tilting the target, the high-energy source, and/or adjusting strength of electrical or magnetic field implemented within the PVD chamber. In one example, the directional deposition may be accomplished by guiding the high-energy deposition particles (e.g., ionized particles) with an automatic capacitance tuner (ACT) system configured on a sample holder (e.g., an electrostatic chuck, or "E-chuck") on which semiconductor structure 500 is disposed. By adjusting a bias of the E-chuck using the ACT system (driven by a radio-frequency, or RF, power, for example), ionized particles may be readily attracted and accelerate in a desired direction toward semiconductor structure 500. In a further example, sub-layer 542 may be formed by deposition process 502 to a thickness $t_1$ from about 30 Angstrom to about 60 Angstrom.

In FIG. 5D, still referring to block 320, sub-layer 543 is thereafter formed over sub-layer 542 and on sidewall surfaces 534 and 536 of opening 540 in a deposition process 504. Sub-layer 543 includes a nitride, such as TiN, TaN, other suitable materials, or combinations thereof. If any sidewall residual portion of sub-layer 542 is present on the sidewalls of opening 540, its thickness is less than that of sub-layer 543. Sub-layer 543 may be formed by any suitable deposition process, such as CVD, ALD, PVD, other suitable methods, or combinations thereof. In the depicted embodiment, sub-layer 543 is deposited conformally by a method such as ALD over opening 540 and the top surface of dielectric layer 530. In one such example, sub-layer 543 may be deposited using an ALD process at a temperature of about 250 degrees Celsius to about 400 degrees Celsius and at a pressure of about 0.5 Torr to about 5.0 Torr. In some embodiments, nitrogen atoms diffuse from sub-layer 543 to sub-layer 542 after implementing deposition processes 502 and 504. In some embodiments, sub-layer 543 may be formed to a thickness $t_2$ that is less than thickness $t_1$ of sub-layer 542. On one hand, sub-layer 543 should have a substantial thickness such that it may prevent the underlying sub-layer 542 from being oxidized and removed (in part or in entirely) during the subsequent fabrication processes. On the other hand, sub-layer 543 should be thin enough that it could be easily removed during the subsequent fabrication processes. Therefore, in many examples, a ratio of $t_2$ to $t_1$ may be 1:3 to about 5:6.

In some embodiments, method 300 may implement an annealing process after deposition processes 502 and 504. The annealing process is configured to form a silicide layer (such as silicide layer 128) at an interface between sub-layer 542 and the underlying epitaxial source/drain feature 30, as depicted and discussed in FIG. 2B. The annealing process may be performed by a rapid thermal annealing (RTA) process, other suitable methods, or combinations thereof. In one such example, the annealing process is performed by an RTA process at a temperature of about 575 degrees Celsius, a temperature suitable for silicon atoms in epitaxial source/drain feature 30 to react with a metallic element (e.g., Ti, Ta, Al, and/or other suitable metallic elements) of sub-layer 542, for about 15 seconds. Accordingly, a resulting silicide layer includes Si and at least one metallic element such as Ti, Ta, Al, and/or other suitable metallic elements.

In FIG. 5E, referring to block 330, an oxidation process 506 (e.g., an application of oxygen plasma) is applied to semiconductor structure 500 to oxidize portions of barrier layer 544. In many embodiments, oxidation process 506 completely oxidizes both sub-layer 542 and sub-layer 543 formed over the top surface of dielectric layer 530, as well as sub-layer 543 on bottom surface 538 and sidewall surfaces 534 and 536 of opening 540, thereby forming an oxidized layer 546 that includes a metal oxide. In some embodiments, any sidewall residual portion of sub-layer 542 is also oxidized along with sub-layer 543 by oxidation process 506. Oxidized layer 546 may include O, N, Ti, Ta, other suitable materials, or combinations thereof. For embodiments in which sub-layer 543 includes TiN and sub-layer 542 includes Ti, oxidized layer 546 includes Ti, O, and/or N (e.g., titanium oxide and/or titanium oxynitride). In some examples, oxidation process 506 may be implemented at a temperature of about 160 degrees Celsius to about 250 degrees Celsius and with an oxygen flow rate of about 2000 sccm (standard cubic center meter per minute) to about 6000 sccm to form an oxygen plasma. Such temperature and oxygen flow rate may be tuned to ensure that exposed portions of barrier layer 544, namely, both sub-layers 542 and 543 formed over the top surface of dielectric layer 530 and sub-layer 543 formed in opening 540, are fully oxidized. As such, a temperature below about 160 degrees Celsius and an oxygen flow rate below about 2000 sccm may not be adequate to fully oxidize exposed portions of barrier layer 544. A temperature above about 250 degrees Celsius and an oxygen flow rate above about 6000 sccm, on the other hand, may subject other components of semiconductor structure 500 to undesirable oxidation. The oxidation of sub-layer 543 may be controlled by a treatment time of oxidation process 506. In an example embodiment, a treatment time that exceeds about 60 seconds but less than about 90 seconds ensures that sub-layer 543 is completely oxidized and at least a portion of sub-layer 542 is partially oxidized as discussed in detail below. Notably, embodiments of the present disclosure provide that at least a portion of sub-layer 542 remains unoxidized after implementing oxidation process 506. Accordingly, the treatment time may not exceed about 90 seconds.

In some embodiments, still referring to FIG. 5E, oxidation process 506 also partially oxidizes sub-layer 542, i.e., a top portion $542_{top}$ of sub-layer 542, formed on bottom surface 538, while a bottom portion $542_{bottom}$ of sub-layer 542 remains unoxidized. In other words, bottom portion $542_{bottom}$ of sub-layer 542 is free of oxygen and oxidized layer 546 includes oxidized top portion $542_{top}$ and oxidized sub-layer 543. Accordingly, following oxidation process 506, $t_3$, which is the thickness of bottom portion $542_{bottom}$, is less than $t_1$, and thickness $t_4$, which is the thickness of the portion of oxidized layer 546 disposed over bottom portion $542_{bottom}$, is greater than $t_2$, which is the thickness of sub-layer 543 before implementing oxidation process 506. In some examples, $t_3$ is from about 10 Angstrom to about 30 Angstrom. As discussed above, partial oxidation of sub-layer 542 may be achieved by implementing at least about 60 seconds but less than about 90 seconds of oxygen plasma treatment during oxidation process 506. In an alternative embodiment referring to FIG. 5F, oxidation process 506 does not oxidize sub-layer 542 disposed over conductive feature 522 (i.e., on bottom surface 538) but only the portion disposed over the top surface of dielectric layer 530, such that $t_3$ is similar to $t_1$ and $t_4$ is similar to $t_2$. Notably, if the treatment time is implemented at less than about 60 seconds, sub-layer 542 may not be partially oxidized and may remain unoxidized. The unoxidized sub-layer 542 (e.g., bottom portion $542_{bottom}$) remains over conductive feature 522 to form a final barrier layer that is similar to barrier layer 112, 122, and/or 132 as depicted and discussed with reference to FIGS. 2A-2C. The following discussion will continue with the embodiment depicted in FIG. 5E as a non-limiting example.

One factor that may be responsible for the partial oxidation of sub-layer 542 is a loading effect of the oxygen plasma implemented during oxidation process 506. As feature sizes decrease, aspect ratios (i.e., height of a feature over width of a feature) of openings formed during IC fabrication increase accordingly. For example, opening 540 may have a width ranging from about 10 nm to about 15 nm and an aspect ratio (i.e., a ratio of the opening's height over width) ranging from about 5:1 to 10:1. Increased aspect ratio may limit the amount of oxygen plasma supplied to bottom surface 538 of opening 540, thereby reducing the extent of oxidation of sub-layer 542.

Figures 5G, 5H:
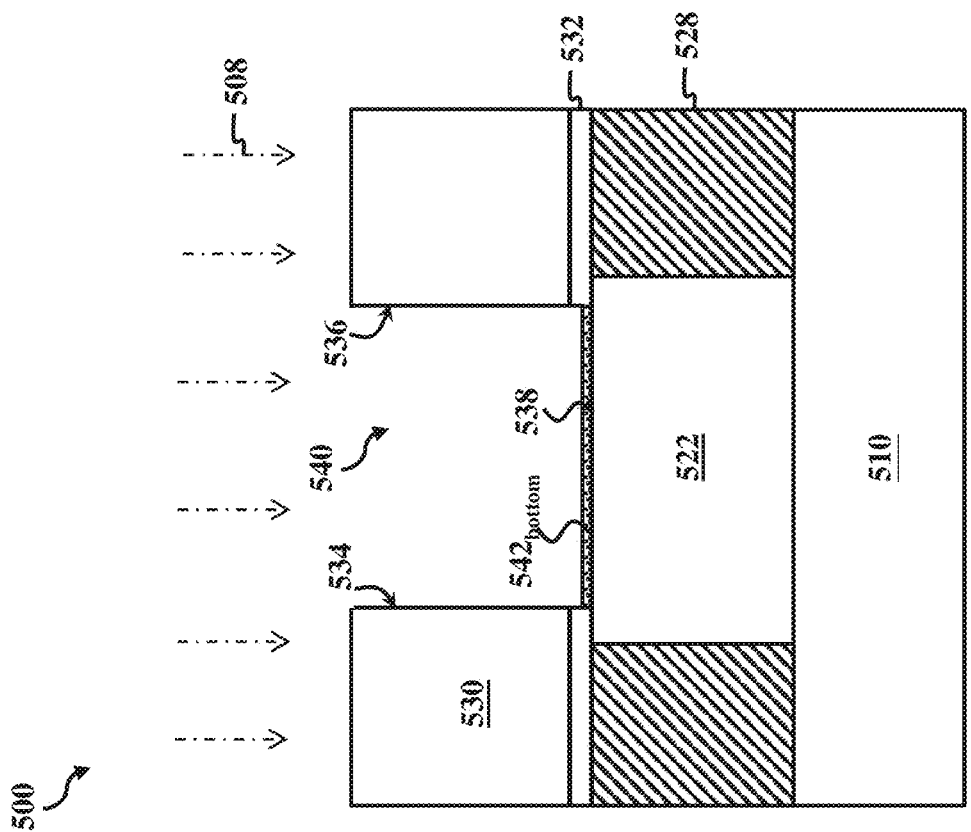

In FIG. 5G, referring to block 340, an etching process is applied to semiconductor structure 500 to selectively remove oxidized layer 546 formed in opening 540 and over the top surface of dielectric layer 530, leaving behind the unoxidized bottom portion $542_{bottom}$ (or the unoxidized sub-layer 542 as depicted in FIG. 5F) disposed over conductive feature 522. In other words, the remaining bottom portion $542_{bottom}$ is oxygen-free. The etching process may be implemented by any suitable method, such as a dry etching process, a wet etching process, an RIE process, other suitable etching processes, or combinations thereof. In many embodiments, the etching process is implemented by a dry etching process utilizing an etchant gas 508 that includes W, Ta, Cl, other suitable elements, or combinations thereof. Non-limiting examples of the etchant gas 508 include tungsten chloride (e.g., $WCl_5$), tantalum chloride (e.g., $TaCl_5$), or a combination thereof. In the depicted embodiment, the etchant gas 508 includes WC's. Because the etchant gas 508 such as $WCl_5$ and $TaCl_5$ only reacts with metal oxides (e.g., titanium oxide and/or titanium oxynitride, or tantalum oxide and/or tantalum oxynitride), oxidized layer 546 is selectively etched during the etching process, while the unoxidized bottom portion $542_{bottom}$ remaining over conductive feature 522 is not etched. An example reaction between $WCl_5$ and titanium oxide and/or titanium oxynitride, as depicted schematically in FIG. 5H, may result in at least $WOCl_4$ and $TiCl_4$, which are both gaseous species capable of being removed from semiconductor structure 500. In many embodiments, such selective removal of oxidized layer 546 increases the space available within opening 540 to accommodate a greater amount of conductive material (e.g., conductive bulk layer 550 discussed below) to be deposited therein, thereby reducing the overall contact resistance of the subsequently formed conductive feature (e.g., conductive feature 552). Furthermore, increasing the space available within opening 540 lowers the aspect ratio of opening 540, allowing easier and more complete filling of opening 540 with the conductive material.

In some examples, the etching process is implemented at a temperature of about 300 degrees Celsius to about 500 degrees Celsius and with the etchant gas at a pressure of about 5 Torr to about 15 Torr. The range of temperature and pressure are not limited to the examples listed herein and may be tuned to achieve optimal etching results.

In some embodiments, as a result of the etching process at block 340, W- or Ta-containing residue from the etchant gas 508 is deposited on the unoxidized bottom portion $542_{bottom}$ but not on sidewall surfaces 534 and 536 of opening 540. In some embodiments, W- or Ta-containing residue is formed on a top surface of the unoxidized bottom portion $542_{bottom}$ at a concentration of at least about 0.1 wt %.

Figure 5J:
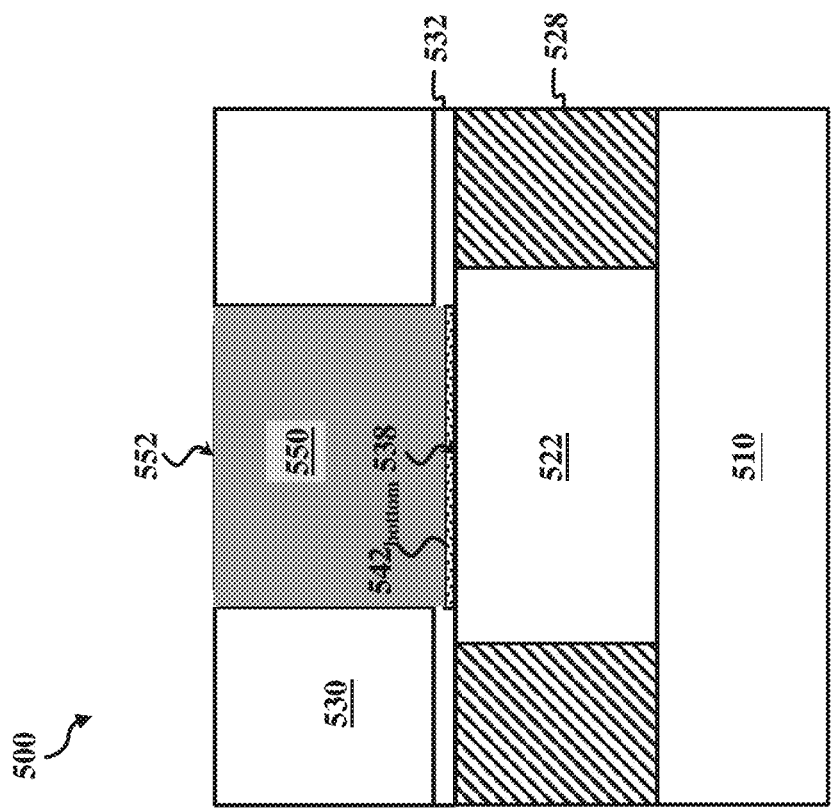
Figure 5I:
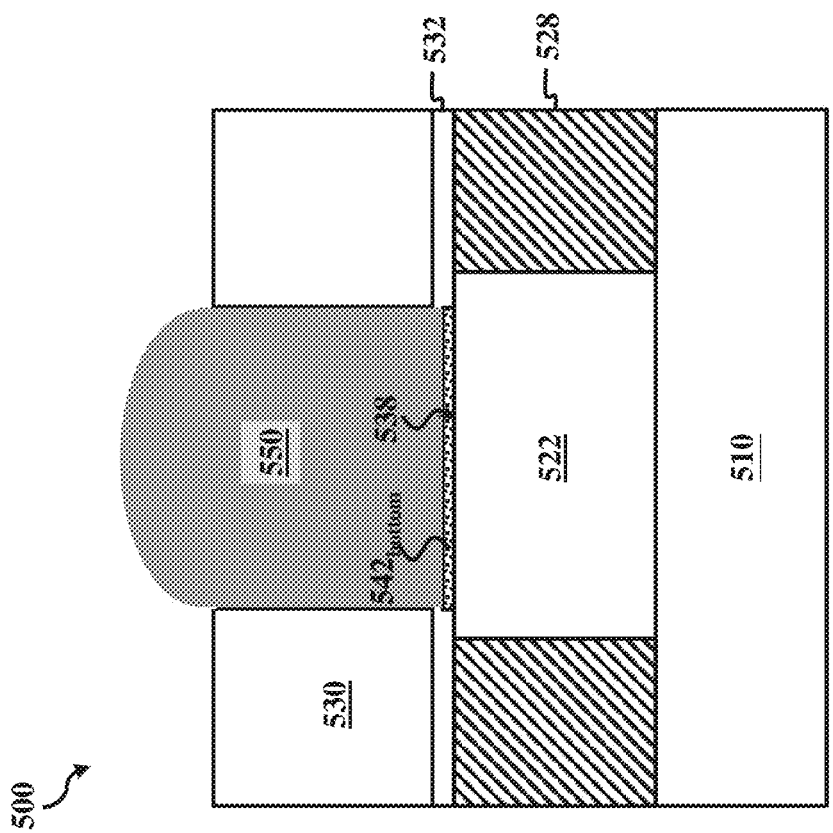

In FIG. 5I, referring to block 350, a conductive bulk layer 550 is deposited in and completely fills opening 540. Conductive bulk layer 550 has a bottom surface defined by the unoxidized portion of sub-layer 542 and sidewall surfaces defined by and in direct contact with dielectric layer 530 (and ESL 532). Conductive bulk layer 550 may include Ru, Co, W, Cu, other suitable conductive materials, or combinations thereof, and may be deposited by any suitable method, such as CVD, PVD, ALD, plating, other suitable methods, or combinations thereof. In some embodiments, conductive bulk layer 550 includes a material having a lower resistivity than W.

In some embodiments, conductive bulk layer 550 includes Ru, Co, or a combination thereof and is deposited using a selective CVD process. In the depicted embodiment, conductive bulk layer 550 fills opening 540 in a bottom-up configuration. In other words, conductive bulk layer 550 first selectively grows on the unoxidized bottom portion $542_{bottom}$ but not on dielectric layer 530, and then continues to grow on itself rather than on dielectric layer 530. In some embodiments, the selective deposition process results in a conductive bulk layer having a top surface with a raised curvature and not spreading over to contact the top surface of dielectric layer 530. In some examples, selective deposition of conductive bulk layer 550 is implemented by a suitable deposition process, such as CVD. However, the selective deposition of Ru and Co differs from non-selective deposition processes in some aspects. For example, before depositing conductive bulk layer 550, a pre-clean process may be implemented to remove any metal oxide present on the unoxidized bottom portion $542_{bottom}$. For forming a Co-based conductive bulk layer 550, a precursor such as $CpCo(CO)_2$ may be used, and for forming a Ru-based conductive bulk layer 550, a precursor such as $Ru_3(CO)_{12}$ may be used. Additionally, selective Co and Ru deposition may be implemented at a lower temperature and pressure than non-selective deposition involving the same materials. For example, selective deposition of Co may be implemented at a temperature of about 150 degrees Celsius to about 225 degrees Celsius with the pressure of the precursor at about 2 Torr to about 20 Torr. Selective deposition of Ru may be implemented at a temperature of about 138 degrees Celsius to about 235 degrees Celsius with the pressure of the precursor at about 2-15 Torr. Of course, other processing temperature and pressure values may also be applicable to embodiments of the present disclosure. In further examples, conductive bulk layer 550 may be formed to a thickness of about 300 Angstrom to about 1500 Angstrom, which can be tuned by controlling the duration of deposition. A specific thickness of conductive bulk layer 550 is not limited by the present disclosure as it may be tuned to accommodate specific design requirements.

In FIG. 5J, referring to block 360, conductive bulk layer 550 is planarized by a process such as CMP to form a conductive feature 552. Depending upon specific design requirement, conductive feature 552 may be similar to device-level contact 60 (e.g., a gate contact), device-level contact 64 (e.g., an epitaxial source/drain contact), or via 72 as depicted and discussed in FIGS. 1 and 2A-2C.

Figures 6, 7:
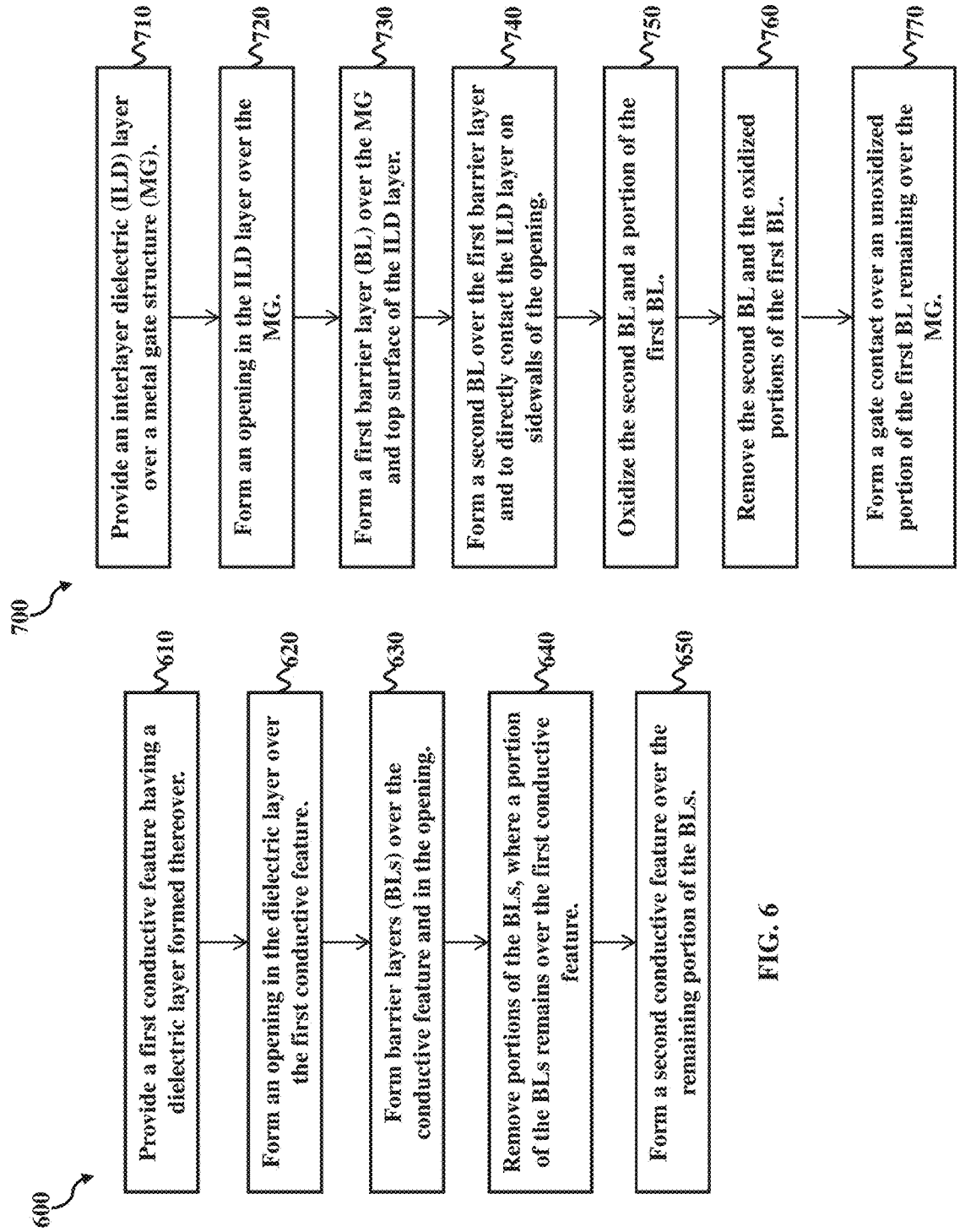
FIG. 6 is a flow chart of a method for fabricating a semiconductor structure according to various aspects of the present disclosure.
FIG. 7 is a flow chart of a method for fabricating a semiconductor structure according to various aspects of the present disclosure.

The present disclosure further provides a method 600 for fabricating a semiconductor structure similar to the semiconductor structure 500 as depicted and described with reference to FIGS. 5A-5G, 5I, and 5J. Referring to FIG. 6, at block 610, method 600 provides a first conductive feature that includes a dielectric layer formed thereover. The first conductive feature may be similar to conductive feature 522 and the dielectric layer may be similar to dielectric layer 530 as discussed above. At block 620, method 600 forms an opening (e.g., a gate contact opening), which is similar to opening 540 as discussed above, in the dielectric layer to expose a portion of the first conductive feature. At block 630, method 600 forms a first barrier layer over the first conductive feature and top surface of the dielectric layer and a second barrier layer over the first barrier layer and along sidewalls of the opening, where the first barrier layer is similar to sub-layer 542 of barrier layer 544 and the second barrier layer is similar to sub-layer 543 of barrier layer 544 as discussed above. At block 640, method 600 removes the second barrier layer and optionally a portion of the first barrier layer, resulting in a remaining portion of the first barrier layer disposed over the conductive feature. In many embodiments, the portion of the first and the second barrier layers removed at block 640 is similar to oxidized layer 546 and the remaining portion is similar to unoxidized bottom portion $542_{bottom}$ or unoxidized sub-layer 542 disposed over the conductive feature 522 as discussed above. At block 650, method 600 forms a second conductive feature, which is similar to conductive feature 552 as discussed above, over the remaining portion of the first barrier layer. Additional steps can be provided before, during, and after method 600, and some of the steps described can be moved, replaced, or eliminated for additional embodiments of method 600.

Still further, the present disclosure provides a method 700 for fabricating a semiconductor structure similar to the semiconductor structure 500 as depicted and described with reference to FIGS. 5A-5G, 5I, and 5J. Referring to FIG. 7, at block 710, method 700 provides an interlayer dielectric (ILD) layer formed over a metal gate structure. The conductive feature may be similar to conductive feature 522 and the ILD layer may be similar to dielectric layer 530 as discussed above. At block 720, method 700 patterns the ILD layer to form an opening (e.g., a gate contact opening), which is similar to opening 540 as discussed above, over the metal gate structure. At block 730, method 700 deposits a first barrier layer similar to sub-layer 542 over the metal gate structure and over a top surface of the ILD layer. At block 740, method 700 deposits a second barrier layer similar to sub-layer 543 over the first barrier layer and along sidewalls of the opening to contact the ILD layer directly. At block 750, method 700 performs an oxidation process to the first and the second barrier layers, such that the second barrier layer is oxidized and a portion of the first barrier layer disposed over the top surface of the ILD layer are also oxidized. In many embodiments, the oxidized second barrier layer and the oxidized portion of the first barrier layer together form an oxidized barrier layer similar to oxidized layer 546 as discussed above. At block 760, method 700 removes the oxidized barrier layer, leaving behind a remaining portion of the first barrier layer, similar to unoxidized bottom portion $542_{bottom}$ as discussed above, disposed over the metal gate structure. At block 770, method 700 deposits a conductive material, similar to conductive material 550 as discussed above, over the remaining portion of the first barrier layer to form a gate contact similar to conductive feature 552 as discussed above. Additional steps can be provided before, during, and after method 700, and some of the steps described can be moved, replaced, or eliminated for additional embodiments of method 700.

Embodiments of the present disclosure provide methods of forming conductive MLI features. In some embodiments, a method of forming conductive MLI features includes depositing and subsequently oxidizing a barrier layer that comprises Ti, Ta, Al, TiN, TaN, and/or other suitable materials over a conductive feature (e.g., a metal gate structure, a S/D epitaxial feature, another MLI conductive feature, etc.), removing portions of the barrier layer, and depositing a conductive material over the remaining portion of the barrier layer to form the MLI feature. In particular, an etchant including W and Cl may be used to selectively remove the oxidized portions of the barrier layer, such that the remaining portion of the barrier layer is disposed over the conductive feature. In some embodiments, the conductive material includes Ru, Co, and/or other suitable material that selectively grows over the remaining portion of the barrier layer in a bottom-up fashion, such that the resulting MLI feature has sidewall surfaces directly in contact with a surrounding dielectric layer and a bottom surface directly in contact with the remaining portion of the barrier layer.

Although not intended to be limiting, one or more embodiments of the present disclosure provide many benefits to a semiconductor device and a formation process thereof. It is understood, however, that other embodiments may offer additional advantages, and not all advantages are necessarily disclosed herein, and that no particular advantage is required for all embodiments. For example, embodiments of the present disclosure provide methods of reducing the contact resistance of a conductive MLI feature by reducing the amount of barrier layer material(s) (which generally increases contact resistance as feature size decreases) deposited at an interface between the conductive material and the surrounding dielectric material. By reducing the amount of barrier layer material(s) included in the conductive MLI feature, a greater amount of conductive material may be deposited in an opening configured to form the conductive MLI feature, further reducing the contact resistance of the conductive MLI feature.

One aspect of the present disclosure pertains to a method. The method includes: providing a first conductive feature having a dielectric layer formed thereover; forming an opening in the dielectric layer to expose a portion of the first conductive feature; forming a first barrier layer over the first conductive feature and over a top surface of the dielectric layer; forming a second barrier layer over the first barrier layer and on sidewalls of the opening; removing the second barrier layer, resulting in at least a portion of the first barrier layer disposed over the first conductive feature; and forming a second conductive feature over the portion of the first barrier layer, wherein sidewalls of the second conductive feature directly contact the dielectric layer.

Another aspect of the present disclosure pertains to a method. The method includes: providing an interlayer dielectric (ILD) layer formed over a metal gate structure; patterning the ILD layer to form a contact opening over the metal gate structure; depositing a first barrier layer over the metal gate structure and a top surface of the ILD layer; depositing a second barrier layer over the first barrier layer, wherein the second barrier layer directly contacts the ILD layer along sidewalls of the contact opening; oxidize the first and the second barrier layers to form an oxidized second barrier layer and an oxidized portion of the first barrier layer; removing the oxidized second barrier layer and the oxidized portion of the first barrier layer, wherein a remaining portion of the first barrier layer is disposed over the metal gate structure; and depositing a conductive material over the remaining portion of the first barrier layer to form a gate contact.

Another aspect of the present disclosure pertains to a semiconductor structure. The semiconductor structure includes a metal gate structure having an interlayer dielectric (ILD) layer disposed thereover. The semiconductor structure also includes a gate contact disposed in the ILD layer and over the metal gate structure. A bottom surface of the gate contact is defined by a barrier layer disposed over the metal gate structure. Sidewall surfaces of the gate contact are defined by the ILD layer. The sidewall surfaces of the gate contact directly contact the ILD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   source/drain features disposed over a semiconductor substrate;
   a metal gate structure disposed over a channel region interposing the source/drain features;
   an interlayer dielectric (ILD) layer disposed over the metal gate structure;
   a barrier layer disposed over and in direct contact with a top surface of the metal gate structure, wherein the barrier layer is free of nitrogen; and
   a gate contact entirely embedded in the ILD layer, wherein a bottom surface of the gate contact directly and completely contacts a top surface of the barrier layer, and wherein sidewalls of the gate contact continuously extend from sidewalls of the barrier layer to directly contact the ILD layer.

2. The semiconductor structure of claim 1, wherein the barrier layer includes titanium, tantalum, aluminum, or combinations thereof.

3. The semiconductor structure of claim 1, wherein the barrier layer includes tungsten.

4. The semiconductor structure of claim 3, wherein the sidewalls of the gate contact are free of tungsten.

5. The semiconductor structure of claim 1, wherein the gate contact includes ruthenium, cobalt, or a combination thereof.

6. The semiconductor structure of claim 1, wherein the barrier layer includes silicon.

7. The semiconductor structure of claim 1, further comprising an etch-stop layer disposed below and is in direct contact with the ILD layer, wherein sidewalls of the barrier layer are fully embedded in the etch-stop layer.

8. A semiconductor structure, comprising:
   a metal gate stack disposed over a substrate;
   an interlayer dielectric (ILD) layer disposed over the metal gate stack; and
   a conductive feature disposed over and directly contacting the metal gate stack, wherein the conductive feature includes:
      a barrier layer directly contacting a top surface of the metal gate stack, wherein the barrier layer is nitrogen-free; and
      a conductive layer disposed over and directly contacting an entire top surface of the barrier layer, wherein the conductive layer is tungsten-free, and wherein sidewalls of the conductive layer are free of contact with the barrier layer.

9. The semiconductor structure of claim 8, wherein the substrate includes a source/drain (S/D) feature disposed adjacent the metal gate stack, and wherein the conductive feature is a gate contact.

10. The semiconductor structure of claim 8, wherein the barrier layer includes titanium, tantalum, aluminum, or combinations thereof.

11. The semiconductor structure of claim 8, wherein the conductive layer includes ruthenium, cobalt, or a combination thereof.

12. The semiconductor structure of claim 8, wherein the barrier layer includes a silicide.

13. The semiconductor structure of claim 8, wherein the ILD layer is a first ILD layer, the semiconductor structure further comprising:
   a second ILD layer, wherein the metal gate stack is disposed entirely in the second ILD layer; and
   an etch-stop layer (ESL) disposed between the first and the second ILD layers, wherein the barrier layer is fully embedded in the ESL.

14. The semiconductor structure of claim 13, wherein sidewalls of the barrier layer are entirely in direct contact with the ESL.

15. The semiconductor structure of claim 13, wherein the ESL directly contacts the top surface of the metal gate stack.

16. A semiconductor structure, comprising:
   source/drain features disposed over a substrate;
   a gate stack interposing the source/drain features;
   a first interlayer dielectric (ILD) layer disposed over the source/drain features, wherein the gate stack is entirely disposed in the first ILD layer;
   a second ILD layer disposed over the first ILD layer;
   a first metal layer in direct contact with the gate stack or the source/drain features, wherein the first metal layer is free of nitrogen; and
   a second metal layer disposed in the second ILD layer to directly contact a top surface of the first metal layer in its entirety, wherein sidewalls of the second metal layer extend away from sidewalls of the first metal layer to directly contact the second ILD layer.

17. The semiconductor structure of claim 16, wherein the first metal layer includes titanium, tantalum, aluminum, or combinations thereof, and wherein the second metal layer includes ruthenium, cobalt, or a combination thereof.

18. The semiconductor structure of claim 16, wherein the first metal layer includes a silicide.

19. The semiconductor structure of claim 16, further comprising an etch-stop layer disposed between the first and the second ILD layers.

20. The semiconductor structure of claim 19, wherein the first metal layer is entirely embedded in the etch-stop layer.

* * * * *